United States Patent [19]

Stimple et al.

[11] 4,156,848

[45] May 29, 1979

[54] HIGH DYNAMIC RANGE DETECTOR FOR INDICATING THE QUIETING LEVEL OF AN FM RECEIVER

[75] Inventors: James R. Stimple, Hoffman Estates, Ill.; Timothy P. Craig, Georgetown, Ky.

[73] Assignee: Motorola, Inc., Schaumburg, Ill.

[21] Appl. No.: 792,962

[22] Filed: May 2, 1977

[51] Int. Cl.² .......................... H04B 1/16; H04B 17/00
[52] U.S. Cl. .................................... 325/344; 325/364; 329/146
[58] Field of Search ............... 325/304, 305, 344, 363, 325/364, 398, 455; 329/146, 167, 192; 328/150; 307/261, 350

[56] References Cited

U.S. PATENT DOCUMENTS

| | | |
|---|---|---|
| 3,435,353 | 3/1969 | Sauber .................................. 329/146 |
| 3,525,045 | 8/1970 | Von Recklinghausen .......... 325/398 |
| 3,673,499 | 6/1972 | Avins et al. ........................... 325/398 |
| 3,753,120 | 8/1973 | Ohsawa ................................. 325/398 |
| 3,965,425 | 6/1976 | Peterson et al. ...................... 325/398 |

*Primary Examiner*—Robert L. Griffin
*Assistant Examiner*—Marc E. Bookbinder
*Attorney, Agent, or Firm*—Victor Myer; James W. Gillman

[57] ABSTRACT

The pre-limited IF signal from an FM receiver is coupled to a pair of linear amplifiers in a cascade configuration. The outputs from the amplifiers are detected and passed to piecewise linear amplifiers. Each piecewise linear amplifier is designed to exhibit a gain characteristic which is dependent on the level of signals applied at its input. A summing circuit sums the piecewise linear amplified signals in predetermined proportion to thereby produce a DC signal which is linearly related to the receiver's quieting level.

3 Claims, 5 Drawing Figures

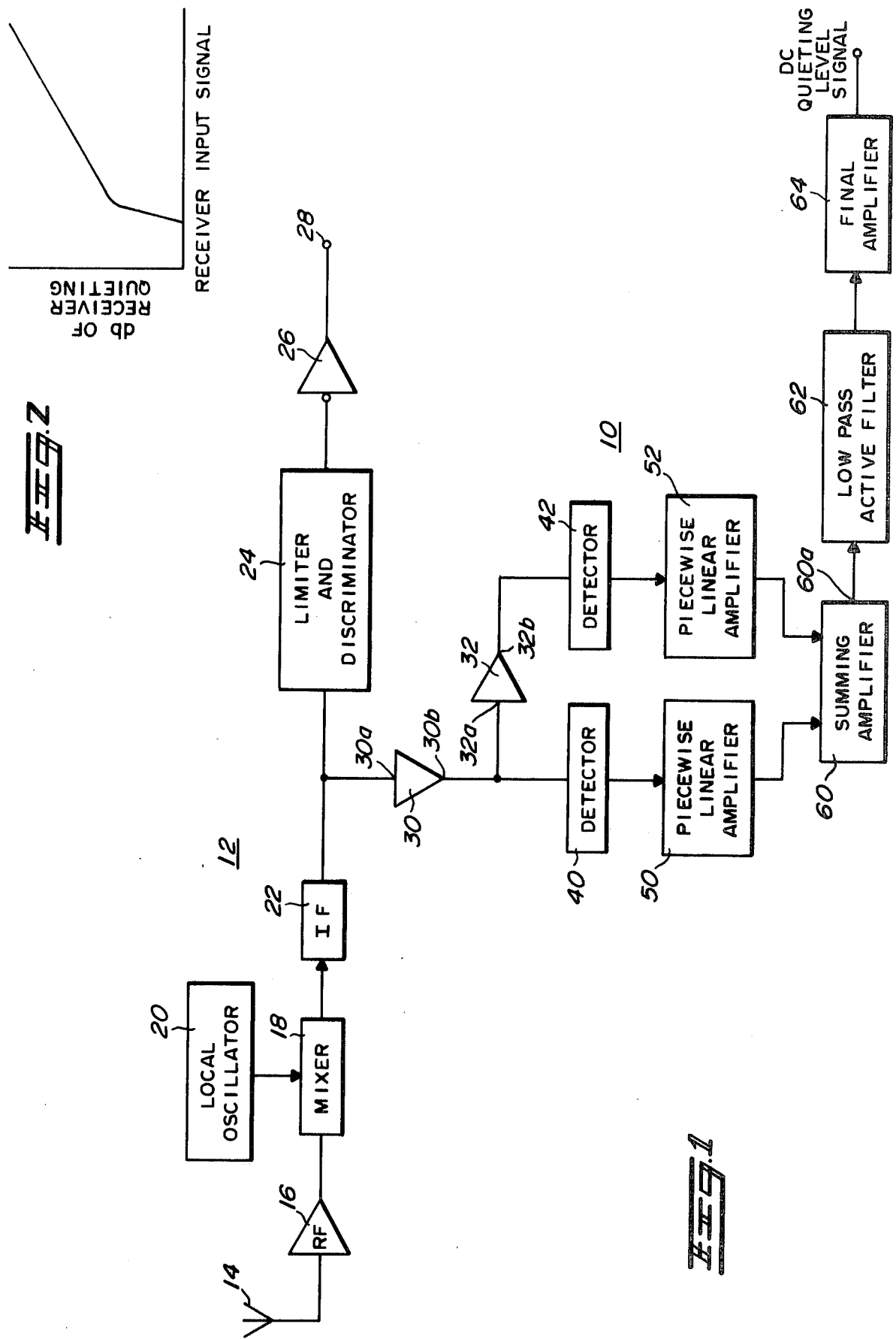

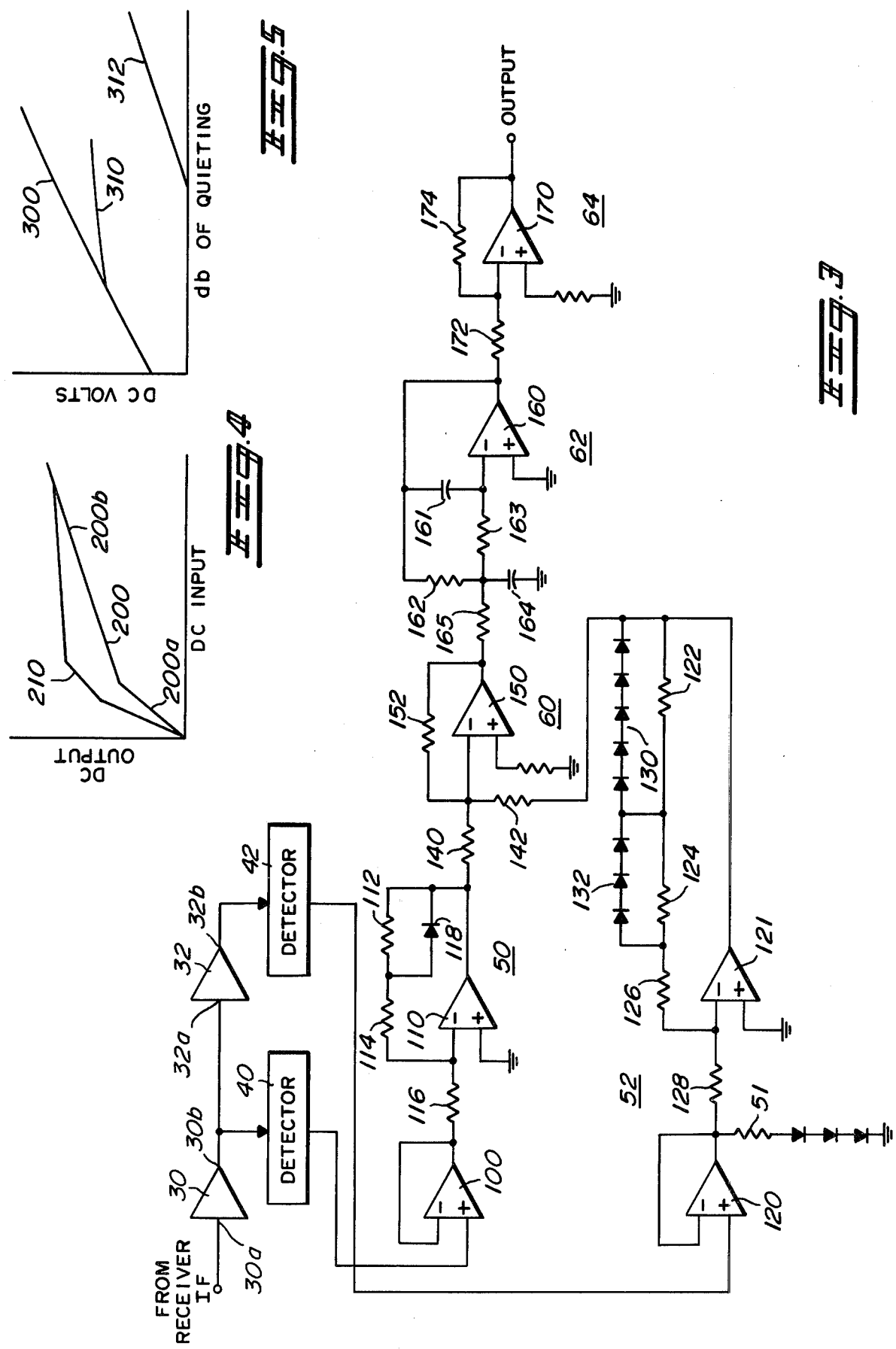

HIGH DYNAMIC RANGE DETECTOR FOR INDICATING THE QUIETING LEVEL OF AN FM RECEIVER

BACKGROUND OF THE INVENTION

The present invention pertains to the signal processing art and, more particularly, to detector circuitry for producing an indication of the relative level of an AC signal.

Signal strength detectors are well known, especially in the radio communication art. Here, there are numerous applications wherein it is desirable to produce a DC signal whose magnitude is representative of the level of an AC signal. Heretofore, there have been several systems which processed an AC signal via a cascade arrangement of amplifiers, each feeding an individual detector, for producing an output signal having a DC magnitude representative of the log of the input AC signal.

Recently, the development of a sectored antenna receiving system has required the use of a wide range signal detector which is capable of producing an output DC signal whose magnitude is linearly related to the quieting level of an FM receiver. This sectored antenna receiving system is more fully described in a copending U.S. patent application entitled "Sectored Antenna Receiving System" invented by James Stimple and Timothy Craig, Ser. No. 792,963, filed May 2, 1977, and an additional U.S. patent application entitled "Sectored Antenna Receiving System", invented by James Stimple, Timothy Craig and Paul Erickson, Ser. No. 792,961, filed May 2, 1977, both of said applications being assigned to the same assignee as the instant application. There, a scanning system constantly couples each one of a plurality of antenna sectors to receiver circuitry. Scan control logic monitors the signals received by each sector to operate in additional scanning modes. Proper operation of these systems requires signal detector circuitry which is capable of monitoring the intermediate frequency level of signals received from each sector and to then produce a DC signal having a representative magnitude. Thus, a signal detector for use in this application must have a response characteristic which tracks that of the inherent quieting response of the FM receiver. None of the prior art signal detectors, most of which have a logarithmic response, would be suitable for providing the precise tracking required in the aforementioned sectored antenna receiving systems.

A further requirement imposed on a signal detector for use in the above application is that it must be capable of handling signal levels over a broad dynamic range.

SUMMARY OF THE INVENTION

It is an object of this invention, therefore, to provide an improved signal detector circuit which is suitable for producing an output DC signal which is linearly related to the quieting level of an FM receiver.

A further object of the invention is to provide the above described signal detector which is capable of handling a high dynamic range of input signals.

Briefly, according to the invention, the signal strength detector produces a DC signal representative of the magnitude of an AC signal. The detector includes first and second linear amplifiers, each of which has an input terminal, an output terminal and includes circuitry for amplifying signals received at its input terminal and reproducing these signals multiplied by a predetermined gain factor at its output terminal. The amplifiers are coupled in cascade such that the output of the first amplifier is coupled to the input of the second amplifier. A first detector couples to the output of the first amplifier and produces a first DC signal representative of the level of AC signal thereat. Correspondingly, a second detector couples to the output of the second linear amplifier and produces a second DC signal, whose value is representative of the level of the AC signal out of the second amplifier. The first and second DC signals are each fed to first and second piecewise linear amplifiers, respectively. Each of the piecewise linear amplifiers exhibits a gain characteristic which is predeterminedly piecewise linearly related to the level of signals received at its input terminal. A summing means sums the two signals in a predetermined proportion. The output from the summer is processed in processing circuitry to thus produce the DC signal.

In particular, the signal detected by the signal detector means is out of the prelimited portion of the receiver. The gain characteristics of the piecewise linear amplifiers, along with the predetermined proportion summing of the summing means, are selected to produce a DC output voltage whose magnitude is linearly related to the quieting level of the receiver.

BRIEF DESCRIPTION OF THE DRAWINGS

FIG. 1 is a block diagram illustrating the preferred construction of the signal detector in combination with an FM radio receiver;

FIG. 2 is a quieting level response plot of the FM receiver shown in FIG. 1;

FIG. 3 is a detailed schematic diagram of the preferred embodiment of the signal detector; and FIG. 4 is a response plot of the piecewise linear amplifiers shown in FIG. 3; and FIG. 5 is a composite response plot illustrating operation of the inventive signal detector.

DETAILED DESCRIPTION OF THE PREFERRED EMBODIMENT OF THE INVENTION

Referring to FIG. 1, the inventive signal detecting circuitry 10 is shown in combination with a conventional FM radio receiver 12. Radio receiver 12 includes an antenna for picking up radio frequency (RF) signals and applying these signals to an RF amplifier stage 16. Stage 16 is of conventional design providing selectivity at the frequencies of interest. RF amplifier 16 feeds to a conventional mixer 18 which, via the local oscillator 20, converts the input RF signal to a selected intermediate frequency.

The output from the mixer 18 is fed to a conventionally designed intermediate frequency stage 22 which amplifies and filters the converted RF signal. Thereafter, a limiter and discriminator 24 recovers the audio or data information from the intermediate frequency signal, which recovered signal is then amplified in an amplifier 26 and provided at an output terminal 28.

The detector circuitry 10 includes a pair of linear amplifiers 30, 32, each amplifier having an input terminal 30a, 32a and an output terminal 30b, 32b, respectively. The amplifiers 30, 32 act in the conventional manner to amplify signals received at input terminals 30a, 32a by a predetermined gain factor, reproducing these signals at the output terminals 30b, 32b, respectively. The amplifiers 30, 32 are coupled in cascade whereby the output 30b of the first amplifier 30 couples to the input 32a of the second amplifier 32. In the conventional manner, cascading of the stages 30, 32 provides increased system dynamic range by a factor of 2. Coupled to the input 30a of the first amplifier 30 is the pre-limited intermediate frequency signal from the receiver 12.

Shown coupled to each linear amplifier 30, 32 output terminal 30b, 32b are detector circuits 40, 42. The detector circuits 40, 42, (which may be either of the peak or average signal level responding type) produce DC output signals representative of the magnitude of either the peak, or average input AC signal.

The first and second detector DC levels produced by the first and second detectors 40, 42, respectively, are fed to piecewise linear amplifiers 50, 52, respectively. Each piecewise linear amplifier 50, 52 is provided with internal circuitry, which is more fully described with respect to FIG. 3, which exhibits a gain characteristic predeterminedly dependent on the level of input signals.

The piecewise linearly amplified detector signals from the amplifiers 50, 52 are summed in a summing amplifier 60. The summing amplifier 60 includes weighting circuitry for amplifying the first and second piecewise linear amplifier outputs in a predetermined proportion to thereby produce a resultant DC signal at the summer amplifier output 60a.

The summing amplifier output signal at its output 60a is further processed in a low pass active filter 62 and a final amplifier 64.

Operation of the system may be understood as follows. Intermediate frequency signals from the receiver 12 are amplified via the cascaded linear amplifiers 30, 32. The first and second detectors 40, 42 each produce a DC level corresponding to the level of input AC signals. Thus, the DC output level from the second detector 42 exceeds that from first detector 40 due to the extra stage of amplification provided by the second linear amplifier 32.

The detector produced DC levels are then predeterminedly amplified by the piecewise linear amplifiers 50, 52. While the design of amplifiers 50, 52 is more fully described with respect to FIGS. 3 and 4, it is a feature of the invention that due to the piecewise linear amplification of the detector DC signals, and the subsequent proportionate summing in the summing amplifier 60, the DC output from the summing amplifier 60 at its output 60a is directly proportional to the DB quieting level of the receiver 12.

As the output from summing amplifier 60 may contain other than DC components due to noise from the receiver, and so forth, the DC signals are low pass filtered in filter 62 and finally amplified by amplifier 64 to thereby provide the DC quieting level signal.

Further, by using the cascade linear amplifier arrangement and the parallel paths of detectors 40, 42 and piecewise linear amplifiers 50, 52 the system may be made quite linear over a wide range of input signal levels. In this, the preferred embodiment of the invention, the system may handle signals having a dynamic range of over 50 db.

FIG. 2 illustrates the DB of quieting of the FM receiver 12 shown in FIG. 1 as a function of input signal level. It should be observed that quieting is a nonlinear function of input signal level and, thus, the signal detector circuitry must take into account these nonlinearities in order to produce an output DC voltage which tracks the receiver quieting.

FIG. 3 illustrates a preferred embodiment of the detector circuitry shown in FIG. 1. Here, signals from the receiver IF are fed to the cascaded linear amplifier pair 30, 32, each of which has input terminals 30a, 32a and output terminals 30b, 32b, respectively.

Each linear amplifier output terminal 30b, 32b is fed to a peak detector circuit 40, 42 which produces an output DC voltage proportional to the peak signal level of signals from the linear amplifiers 30, 32. Since the signal level to the second detector 42 is preceded by two stages of gain, i.e. both amplifiers 30 and 32, its detected output exceeds that from the detector 40 over the full range of system operation. The output from the first detector 40 is fed to a conventional operational amplifier buffer stage 100 and then to a piecewise linear amplifier 50, comprising an operational amplifier 110. Amplifier 50 is of the inverting operational amplifier type having feedback resistors 112, 114 and an input resistor 116. Shunt across one feedback resistor 112 is a conventional silicon switching diode 118. Operation of the piecewise linear amplifier 110 is more fully described herein below.

The output from the second detector 42 is fed to a conventional operational amplifier buffer stage 120. The output from buffer stage 120 is fed to the second piecewise linear amplifier 52 which includes an operational amplifier 121, also coupled in an inverting amplifier configuration. Negative feedback from the output of amplifier 120 is coupled through resistors 122, 124 and 126 where they couple to the input resistor 128. A five diode string 130 shunts resistor 122, and a three diode string 132 shunts resistor 124.

The desired operation of the piecewise linear amplifiers 50, 52 is more fully appreciated with respect to FIG. 4. It is the function of these amplifiers to produce output DC signals, which, when proportionally summed, track the receiver quieting level response block as shown in FIG. 2, whereby the summed output is approximately a linear function of signal quieting level. Thus, the piecewise linear amplifiers 50, 52 must exhibit a gain characteristic which is a function of the level of input signals.

This function is accomplished by the diodes which shunt resistors in the feedback path of the amplifiers.

Thus, for example, the first piecewise linear amplifier 50 produces the output response curve 200. Curve 200 is shown to have two gain characteristics, i.e. a higher gain characteristic for a first portion 200a and a lower gain characteristic for a subsequent portion 200b. Referring again to FIG. 3, for low level input signals to the operational amplifier 110, the gain of the amplifier is the ratio of the sum of resistors 112 and 114 to the resistor 116. As the input signal level increases in magnitude, the output of operational amplifier 110 becomes more negative, whereby diode 118 becomes forward biased. With diode 118 forward biased resistor 112 is effectively removed from the feedback path of the amplifier 110 such that its gain now becomes a ratio of resistor 114 to resistor 116. Thus, the circuit components are selected such that the piecewise linear gain breakpoint of the amplifier 50 occurs at turn on of diode 118.

Referring again to FIG. 4, the desired response plot of the second piecewise linear amplifier 52 is shown as the graph 210. Here, the breakpoints in gain are determined by the level of output signal required to turn on the diode strings 130, 132 to thereby short out feedback resistors 122, 124, respectively.

Referring again to FIG. 3, the outputs from the piecewise linear amplifiers 50, 52 are fed through summing resistors 140, 142 to the summing amplifier 60. Summing amplifier 60 includes an operational amplifier stage 150 operated in the inverting amplifier configuration. Feedback across the amplifier 150 is provided by feedback resistor 152. In the well known manner, the gain provided by the summing amplifier stage 60 to the output of the first piecewise linear amplifier 50 is the ratio of the feedback resistor 152 to input resistor 140 whereas the gain provided to the output from the second piecewise linear amplifier 52 is determined by the ratio of feedback resistor 152 to resistor 142.

By selecting appropriate summing resistors 140, 142 the piecewise linear amplifier signals may be proportionately summed to produce the desired output DC signal having a linear relationship to receiver quieting, as is shown in FIG. 5.

FIG. 5 is a composite drawing illustrating the manner in which the outputs from the piecewise linear amplifiers 50, 52 are combined to yield the desired linear DC output voltage as a function of DB of receiver quieting. Curve 310 illustrates the DC output voltage at the output of piecewise linear amplifier 52 as a function of quieting level of the receiver. Correspondingly, curve 312 illustrates the output from piecewise linear amplifier 50 as a function of receiver quieting level. It can be seen that by scaling the curve 312, the summed outputs from the piecewise linear amplifiers 50, 52 provide curve 300 which is the desired linear output DC voltage corresponding to the level of receiver quieting.

To remove any undesired high frequency components or noise from the DC signal at the summing amplifier output 60a, a conventionally designed active low pass filter is incorporated. This filter is comprised of an operational amplifier 160 and external frequency determining components 161–165.

Finally, the output from the low pass filter stage 62 is amplified by the final amplifier stage 64 comprised of an operational amplifier 170 in an inverting configuration with input resistor 172 and feedback resistor 174.

Thus, the output from final amplifier 164 exhibits the characteristics illustrated in FIG. 5, i.e. the linear output voltage as a function of DB of receiver quieting level.

In summary, an improved signal detector circuit has been described which is especially adaptable for providing an output DC signal which is a linear function of the quieting level of an FM receiver. The detector is operable over an extremely wide dynamic range of input signal level.

While a preferred embodiment of the invention has been described in detail, it should be apparent that many modifications and variations thereto are possible, all of which fall within the true spirit and scope of the invention.

We claim:

1. Detector means for producing a DC output signal representative of the quieting level of an FM receiver, said receiver exhibiting a predetermined quieting response which is a nonlinear function of the level of AC signal processed by said receiver, said detector comprising:

first and second linear amplifiers, each exhibiting a predetermined gain characteristic, coupled in cascade configuration with the output of said first amplifier coupled to the input of said second amplifier;

coupling means for coupling the receiver processed AC signal, prior to any limiting stages of said receiver, to the input of said first linear amplifier;

detector means for producing a pair of DC output signals representative of the magnitude of the signals from said first and second amplifiers, respectively;

piecewise linear amplifier means for amplifying each of said detector means produced DC signals by a predetermined gain characteristic corresponding to the quieting response of the receiver, said predetermined gain characteristic being a piecewise linear function of the level of said detector produced output signals; and summing means for summing the piecewise linear amplified signals in a predetermined proportion to produce a DC signal which is linearly related to the quieting level of the receiver.

2. The detector means of claim 1 wherein the coupling means includes means for coupling the prelimited intermediate frequency signal from the receiver.

3. The detector of claim 1 further comprising a low pass filter means for filtering the output of said summing means.

* * * * *